(12) United States Patent
Saido

(10) Patent No.: US 10,714,362 B2
(45) Date of Patent: *Jul. 14, 2020

(54) SUBSTRATE PROCESSING APPARATUS AND METHOD OF MANUFACTURING SEMICONDUCTOR DEVICE

(71) Applicant: KOKUSAI ELECTRIC CORPORATION, Tokyo (JP)

(72) Inventor: Shuhei Saido, Tokyo (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/354,864

(22) Filed: Mar. 15, 2019

(65) Prior Publication Data
US 2019/0287829 A1    Sep. 19, 2019

(30) Foreign Application Priority Data

Mar. 15, 2018 (JP) ................................. 2018-047873
Feb. 27, 2019 (JP) ................................. 2019-034073

(51) Int. Cl.
*H01L 21/67*    (2006.01)
*C23C 16/52*    (2006.01)
(Continued)

(52) U.S. Cl.
CPC .... *H01L 21/67011* (2013.01); *C23C 16/4412* (2013.01); *C23C 16/52* (2013.01);
(Continued)

(58) Field of Classification Search
CPC ............... H01L 21/67; H01L 21/67005; H01L 21/67011; H01L 21/673; H01L 21/67303;
(Continued)

(56) References Cited

U.S. PATENT DOCUMENTS 6,369,361 B2 *  4/2002  Saito ...................... C30B 31/12
                                                              118/50.1
8,282,733 B2    10/2012 Yamamoto
(Continued)

FOREIGN PATENT DOCUMENTS

JP    1999-006068 A    1/1999
JP    2003-218040 A    7/2003
(Continued)

OTHER PUBLICATIONS

Japanese Office Action dated Jan. 21, 2020 for Japanese Patent Application No. 2019-034073.
(Continued)

*Primary Examiner* — Eduardo A Rodela
(74) *Attorney, Agent, or Firm* — Volpe and Koenig, P.C.

(57) ABSTRACT

Wafer processing with no dummies is sets forth, wherein an apparatus includes: a boat that hold a product substrates in array at all of positions where substrates may be held; a tubular reactor that houses the boat; a furnace surrounding an upper side and a lateral side of the reactor; a heater provided in the furnace and adapted to heat a side portion of the reactor; a ceiling heater provided in the furnace and adapted to heat a ceiling of the reactor; and a cap heater provided inside the reactor and below the boat; a gas supply mechanism individually supplying a gas to a top side of each of the product substrates.

8 Claims, 9 Drawing Sheets

(51) Int. Cl.
  *H01L 21/673* (2006.01)
  *H01L 21/02* (2006.01)
  *C23C 16/44* (2006.01)
  *H01L 21/687* (2006.01)

(52) U.S. Cl.
  CPC .......... *H01L 21/0217* (2013.01); *H01L 21/67* (2013.01); *H01L 21/673* (2013.01); *H01L 21/67005* (2013.01); *H01L 21/67017* (2013.01); *H01L 21/6732* (2013.01); *H01L 21/67098* (2013.01); *H01L 21/67103* (2013.01); *H01L 21/67109* (2013.01); *H01L 21/67248* (2013.01); *H01L 21/67303* (2013.01); *H01L 21/67309* (2013.01); *H01L 21/68792* (2013.01)

(58) Field of Classification Search
  CPC ........... H01L 21/67309; H01L 21/6732; H01L 21/67098
  See application file for complete search history.

(56) References Cited

U.S. PATENT DOCUMENTS

| | | |
|---|---|---|
| 9,103,029 B2 | 8/2015 | Wamura et al. |
| 9,263,269 B2 | 2/2016 | Okada et al. |
| 10,228,291 B2 | 3/2019 | Osaka et al. |
| 2001/0042594 A1* | 11/2001 | Shamouilian ......... H01J 37/321 156/345.37 |
| 2008/0173238 A1* | 7/2008 | Nakashima ........... C23C 16/345 118/723 R |
| 2011/0303152 A1 | 12/2011 | Asari et al. |
| 2014/0295667 A1 | 10/2014 | Kaga et al. |
| 2014/0342573 A1* | 11/2014 | Hirose .................... C23C 16/36 438/761 |
| 2015/0259799 A1 | 9/2015 | Motoyama et al. |
| 2017/0037512 A1 | 2/2017 | Saido et al. |
| 2017/0294318 A1 | 10/2017 | Yoshida et al. |
| 2017/0301539 A1* | 10/2017 | Sano ....................... C23C 16/36 |
| 2018/0033645 A1 | 2/2018 | Saido et al. |
| 2018/0187307 A1 | 7/2018 | Yoshida et al. |

FOREIGN PATENT DOCUMENTS

| | | |
|---|---|---|
| JP | 2008-047785 A | 2/2008 |
| JP | 2012-004246 A | 1/2012 |
| JP | 2012-004409 A | 1/2012 |
| JP | 2014-056961 A | 3/2014 |
| JP | 2014-208883 A | 11/2014 |
| JP | 2016-157930 A | 9/2016 |
| KR | 10-2010-0057585 A | 5/2010 |

OTHER PUBLICATIONS

Korean Office Action dated Jan. 30, 2020 for Korean Patent Application No. 10-2018-0143336.

* cited by examiner

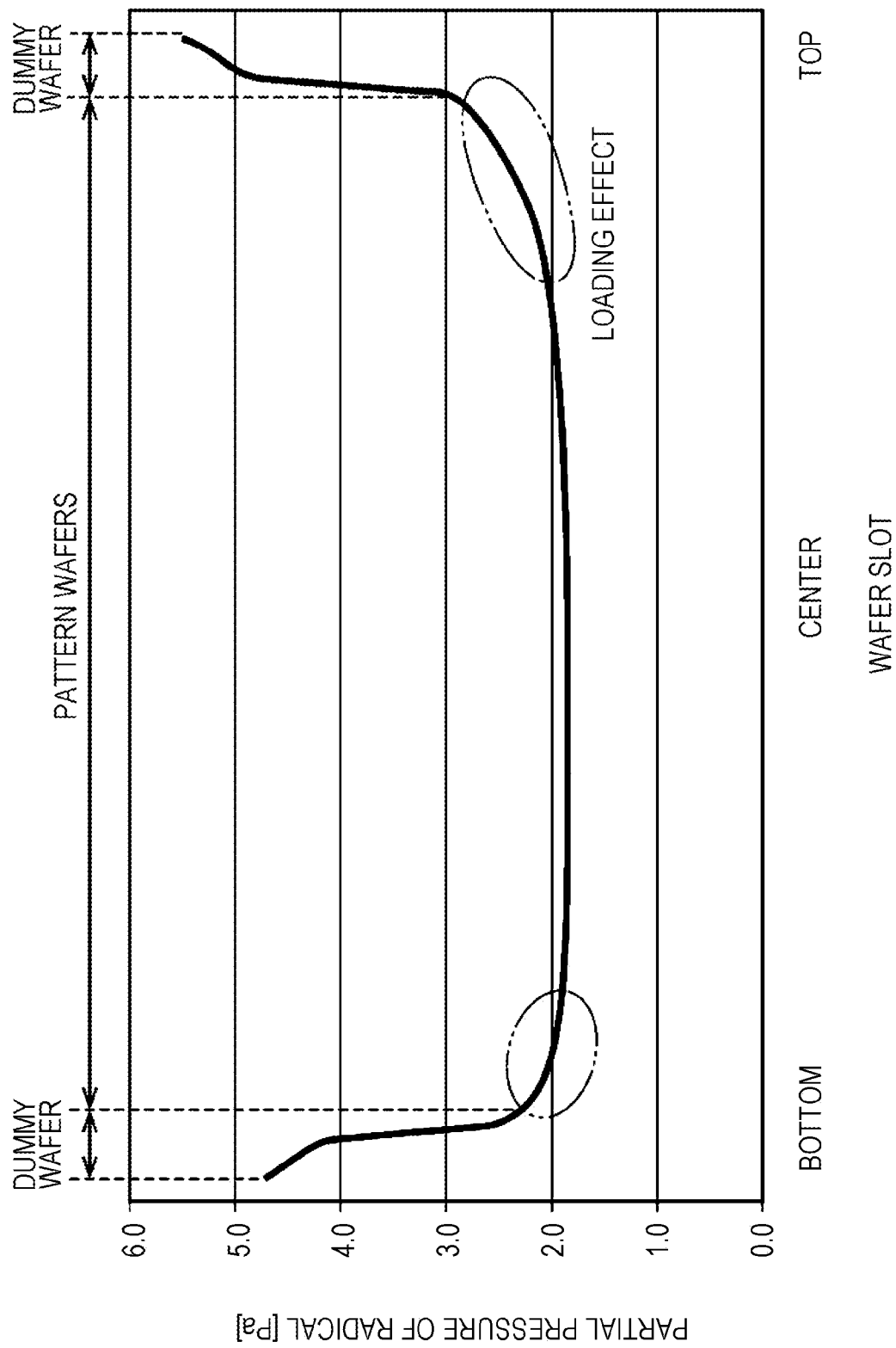

SUBSTRATE PROCESSING APPARATUS AND METHOD OF MANUFACTURING SEMICONDUCTOR DEVICE

CROSS-REFERENCE TO RELATED APPLICATION

This application is based upon and claims the benefit of priority from Japanese Patent Application No. 2018-047873 filed on Mar. 15, 2018, and Japanese Patent Application No. 2019-034073 filed on Feb. 27, 2019, the entire contents of which are incorporated herein by reference.

BACKGROUND

Technical Field

This present disclosure relates to a substrate processing apparatus and a method of manufacturing a semiconductor device.

Related Art

A vertical substrate processing apparatus is used for heat treatment of a substrate (wafer) in a process of manufacturing a semiconductor device (device). In the vertical substrate processing apparatus, a plurality of substrates are arrayed and held in a vertical direction by a substrate holder, and the substrate holder is carried into a process chamber. After that, a process gas is introduced into the process chamber in a state where the process chamber is heated, and a thin film formation processing is performed for the substrate.

JP 2014-208883 A discloses a technique for forming films conformally on a substrate of high pattern density.

SUMMARY

In such prior art as JP 2014-208883 A, uniformity of a film thickness between a substrate arranged at top or bottom position adjacent to pattern dummies and other substrates may be degraded when substrates (wafers) with an extremely large processing surface areas are processed. Therefore, there is still room for improvement. Particularly, rapid degradation in the uniformity of the film thickness at the upper end and the lower end of the substrate region is referred to as reactor-scale (macroscopic) loading effect. In the event of such a loading effect, the number of substrates suitable as products might be reduced, and productivity is decreased.

In one aspect of this present disclosure, a substrate processing apparatus includes: a substrate holder configured to hold plurality of substrates in array at respective positions with predetermined intervals and used to hold a plurality of product substrates at all the positions where the substrates are allocable; a tubular reactor including an opening through which the substrate holder can be carried in and out at a lower side and a ceiling with a flat inner surface and houses the substrate holder; a furnace body surrounding an upper side and a lateral side of the tubular reactor; a main heater provided in the furnace body and configured to heat the side portion of the tubular reactor; a ceiling heater provided in the furnace body and configured to heat the ceiling; a lid that closes the opening; a cap heater arranged inside the tubular reactor and also located below the substrate holder and configured to perform heating; and a gas supply mechanism configured to individually supply a gas to a top side of each of the plurality of product substrates held by the substrate holder inside the tubular reactor.

BRIEF DESCRIPTION OF THE DRAWINGS

FIG. 10 is a diagram illustrating an analysis result on radical distribution relative to wafer holding positions when dummy wafers are held above and below product wafers held at holding positions in the boat of the substrate processing apparatus of the comparative example.

DETAILED DESCRIPTION

Figure 1:
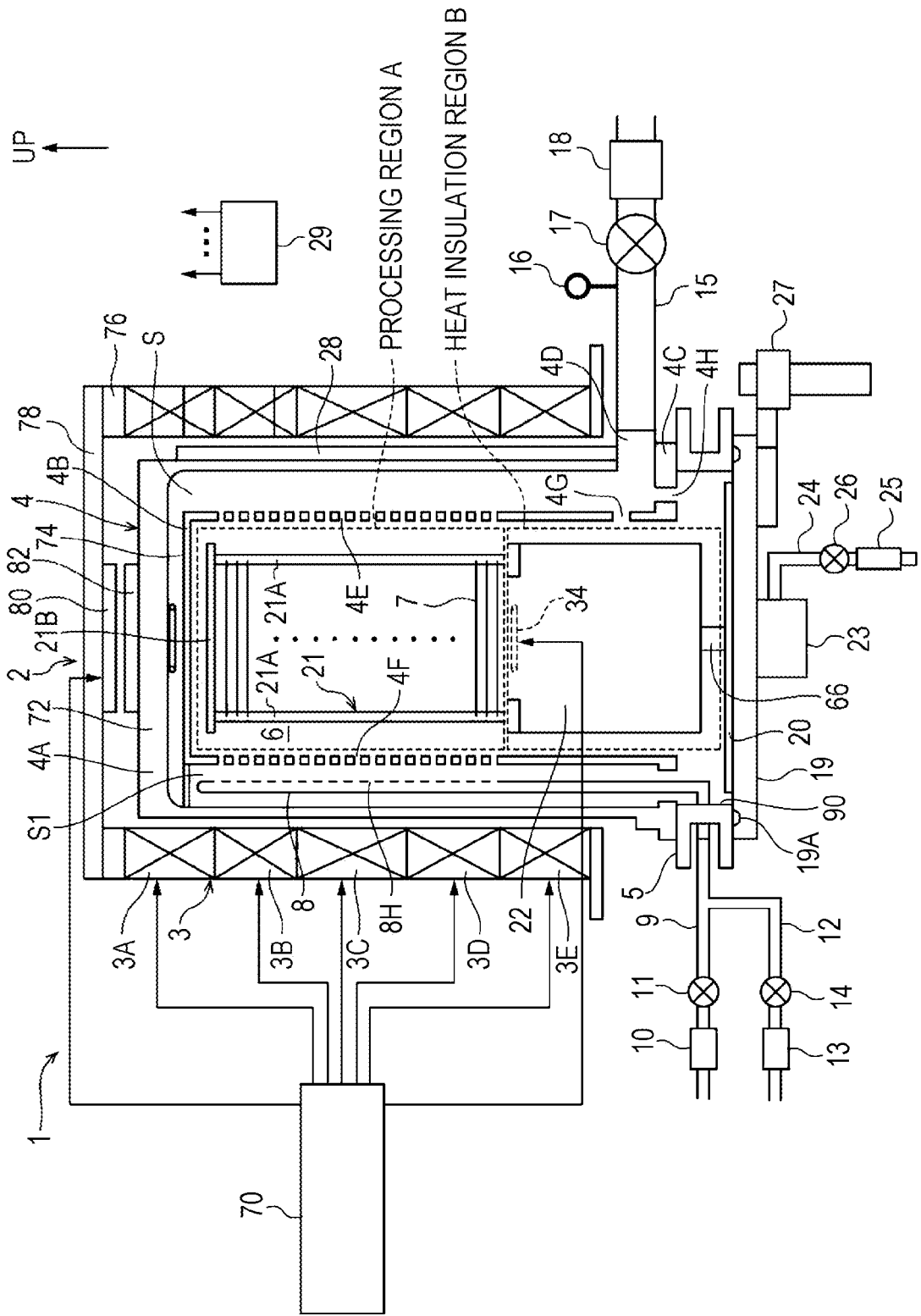
FIG. 1 is a schematic diagram of a substrate processing apparatus according to a first embodiment.

Embodiments will be described below with reference to the drawings. Note that "UP" indicated in the drawings indicates an upper side in a vertical direction of an apparatus.

First Embodiment

A substrate processing apparatus and a method of manufacturing a semiconductor device according to a first embodiment will be described with reference to FIGS. 1 to 8.

As illustrated in FIG. 1, a substrate processing apparatus 1 is formed as a vertical heat treatment apparatus to execute a heat treatment process in manufacture of a semiconductor integrated circuit, and includes a treatment furnace 2 as a furnace body. The treatment furnace 2 includes a heater 3 as a main heater arranged along a vertical direction in order to heat a cylindrical portion of a tubular reactor 4 described later.

The heater 3 has a cylindrical shape and is arranged along the vertical direction around the cylindrical portion (side portion in the present embodiment) of the tubular reactor 4 described later. The heater 3 includes, in the vertical direction, a plurality of heater units obtained by dividing the heater into a plurality of units. In the present embodiment, the heater 3 includes an upper heater 3A, a center upper heater 3B, a center heater 3C, a center lower heater 3D, and a lower heater 3E sequentially from an upper side to a lower side. The heater 3 is installed vertical to an installation floor of the substrate processing apparatus 1 by being supported by a heater base (not illustrated) as a holding plate.

The upper heater 3A, center upper heater 3B, center heater 3C, center lower heater 3D, and lower heater 3E are respectively electrically connected to a power regulator 70. The power regulator 70 is electrically connected to a controller 29. The controller 29 has a function as a temperature controller to control a power amount to each of the heaters by the power regulator 70. A temperature in each of the upper heater 3A, center upper heater 3B, center heater 3C, center lower heater 3D, and lower heater 3E is controlled by controlling a power amount of the power regulator 70 by the controller 29. The heater 3 also functions as an activation mechanism (excitation unit) to activate (excite) a gas with heat as described later.

The tubular reactor 4 constituting a reaction container (processing container) is arranged on an inner side of the heater 3. The tubular reactor 4 is made of a heat resistant material such as quartz (SiO$_2$) or silicon carbide (SiC), and is formed in a cylindrical shape having an upper end closed and a lower end opened. The tubular reactor 4 has a double tube structure including an outer tube 4A and an inner tube 4B joined to each other at a flange 4C located in a lower end. In other words, each of the outer tube 4A and the inner tube 4B is formed in a cylindrical shape, and the inner tube 4B is arranged inside the outer tube 4A. The outer tube 4A is provided with a ceiling portion 72 having an upper end closed. Additionally, the inner tube 4B is provided with a ceiling 74 having an upper end closed, and the inner tube 4B has a lower end opened. The ceiling 74 has a flat inner surface. The outer tube 4A is arranged in a manner surrounding an upper side and a lateral side of the inner tube 4B.

The flange 4C is provided at a lower portion of the outer tube 4A. The flange 4C has an outer diameter larger than an outer diameter of the outer tube 4A, and protrudes outward. An exhaust port 4D communicating with the inside of the outer tube 4A is provided near the lower end of the tubular reactor 4. The entire tubular reactor 4 including the above-described components is integrally formed of a single material. The outer tube 4A is formed relatively thick so as to withstand a pressure difference when the inside thereof is vacuumed.

The treatment furnace 2 includes, on an upper side of the heater 3, a side heat insulator 76 and an upper heat insulator 78 which are arranged so as to respectively cover an obliquely upper side and an upper side of the ceiling portion 72 of the outer tube 4A. As an example, the side heat insulator 76 having a cylindrical shape is provided at the upper portion of the heater 3, and the upper heat insulator 78 is fixed to the side heat insulator 76 in a state of being bridged over the side heat insulator 76. With this structure, the treatment furnace 2 surrounds the upper side and the lateral side of the tubular reactor 4.

A ceiling heater 80 to heat the ceiling portion 72 of the outer tube 4A of the tubular reactor 4 and the ceiling 74 of the inner tube 4B is provided on an upper side of the ceiling portion 72 of the outer tube 4A and also at a lower wall of the upper heat insulator 78. In the present embodiment, the ceiling heater 80 is provided outside the outer tube 4A and electrically connected to the power regulator 70.

The controller 29 controls a power amount to the ceiling heater 80 by the power regulator 70. With this structure, a temperature of the ceiling heater 80 is controlled independently from the temperatures of the upper heater 3A, center upper heater 3B, center heater 3C, center lower heater 3D, and lower heater 3E.

A manifold 5 has a cylindrical or a truncated cone shape and made of a metal or quartz, and is provided so as to support the lower end of the tubular reactor 4. The manifold 5 has an inner diameter larger than an inner diameter of the tubular reactor 4 (inner diameter of the flange 4C). With this structure, an annular space described later is formed between the lower end (flange 4C) of the tubular reactor 4 and a seal cap 19 described later. This space or a member in the vicinity of the space will be collectively referred to as a furnace throat.

The inner tube 4B includes, on a side surface thereof, a main exhaust vent 4E at the more back (higher) side of the tubular reactor 4 than the exhaust port 4D, and supply slits 4F located at positions opposite to the main exhaust vent 4E. Each supply slit 4F is a slit elongating in the circumferential direction, and a plurality of the supply slits 4F is aligned in the vertical direction at equal intervals and provided in a manner corresponding to the respective wafers 7. The main exhaust vent 4E includes slits similar to the supply slits 4F and provides communication between the inside and the outside of inner tube 4B. One or more openings (apertures) that substantially face whole region where wafers 7 as substrates are arranged may be sufficient for the main exhaust vent 4E and the supply slits 4F. Such openings may be realized by a single vertically elongated opening or any other openings with arbitrary shape in arbitrary placement facing directly to each wafers or spaces over the respective wafers without any obstacle. The main exhaust vent 4E and the supply slits 4F may further have an slit-shaped opening located corresponding to a confined space under the lowest wafers 7.

The inner tube 4B further includes a plurality of sub-exhaust vents 4G at positions located on the more inner side of the tubular reactor 4 than the exhaust port 4D and also located closer to the opened side than the main exhaust vent 4E, and the sub-exhaust vents 4G provide communication between a process chamber 6 and an exhaust space S (hereinafter, a space between the outer tube 4A and the inner tube 4B will be referred to as the exhaust space S). Additionally, a plurality of bottom exhaust vents 4H and 4J to provide communication between the process chamber 6 and a lower end of the exhaust space S is also formed at the flange 4C (see FIG. 5). Furthermore, nozzle introduction holes 4K are formed at the flange 4C (see FIG. 5). In other words, the lower end of the exhaust space S is closed by the flange 4C except for the bottom exhaust vents 4H and 4J and the like. The sub-exhaust vents 4G and the bottom exhaust vents 4H and 4J function to mainly exhaust an axial purge gas described later.

The exhaust space S between the outer tube 4A and the inner tube 4B is provided with one or more nozzles 8 to supply a process gas such as a source gas in a manner corresponding to positions of the supply slit 4F. Each nozzle 8 is connected to a gas supply pipe 9 that passes through the manifold 5 and supplies the process gas (source gas).

Each gas supply pipe 9 includes a channel on which a mass flow controller (MFC) 10 functioning as a flow rate controller and a valve 11 functioning as an on-off valve are provided sequentially from an upstream direction. A gas supply pipe 12 to supply an inert gas is connected to the gas supply pipe 9 on a more downstream side than the valve 11. The gas supply pipe 12 is provided with an MFC 13 and a valve 14 sequentially from the upstream direction. Mainly, the gas supply pipe 9, MFC 10, and valve 11 constitute a process gas supply system.

The nozzle 8 is provided inside the gas supply space S1 in a manner standing from a low portion of the tubular reactor 4. One or a plurality of nozzle holes (spouts) 8H to supply a gas is provided on a side surface and an upper end of each nozzle 8. Since the plurality of nozzle holes 8H is opened in a manner corresponding to the respective openings of the supply slits 4F so as to face a center of the tubular reactor 4, the gas can be injected toward the wafers 7 through the inner tube 4B. Gas supply mechanism is a general idea including nozzle 8, nozzle chamber 42, supply slits 4F and also the process gas supply system. The gas supply mechanism discharges process gases into the process chamber 6 from up close to the side of the wafers 7 and delivers the gases individually to a top side of all the wafers 7. Supply amount may be adjusted by degree of apertures of the nozzle 8 or supply slit 4F.

An exhaust pipe 15 to exhaust atmosphere contained inside the process chamber 6 is connected to the exhaust port 4D. The exhaust pipe 15 is connected to a vacuum pump 18 functioning as a vacuum exhaust device via a pressure sensor 16 functioning as a pressure detector (pressure meter) that detects pressure inside the process chamber 6 and via an auto pressure controller (APC) valve 17 functioning as a pressure regulator (pressure adjuster). The APC valve 17 can perform vacuum exhaust and vacuum exhaust suspension inside the process chamber 6 by being opened and closed while the vacuum pump 18 is activated. Furthermore, the APC valve 17 can adjust a pressure inside the process chamber 6 by adjusting a degree of valve opening on the basis of pressure information detected by the pressure sensor 16 while the vacuum pump 18 is activated. Mainly, the exhaust pipe 15, APC valve 17, and pressure sensor 16 constitute an exhaust system. The vacuum pump 18 may also be included in the exhaust system.

A seal cap 19 functioning as a lid that can airtightly close an opening 90 at a lower end of the manifold 5 is provided below the manifold 5. That is, the seal cap 19 functions as the lid to close the outer tube 4A of the tubular reactor 4. The seal cap 19 is made of, for example, a metal such as stainless steel or a nickel-based alloy, and is formed in a disk shape. The seal cap 19 has an upper surface provided with an O-ring 19A as a seal member abutting on the lower end of the manifold 5.

Additionally, the seal cap 19 has the upper surface on which a cover plate 20 to protect the seal cap 19 is installed for a portion located on a more inner side than a lower-end inner circumference of the manifold 5. The cover plate 20 is made of a heat-resistant and corrosion-resistant material such as quartz, sapphire or SiC, and is formed in a disk shape. Since the cover plate 20 is not required to have mechanical strength, the cover plate 20 can be formed with a small thickness. The cover plate 20 is not limited to a component prepared separately from the seal cap 19 but may also be a thin film or thin layer of nitride or the like with which an inner surface of the seal cap 19 is coated or by which quality of the inner surface is modified. The cover plate 20 may also include a wall upstanding from a circumferential edge along an inner surface of the manifold 5.

A boat 21 functioning as a substrate holder is housed inside the inner tube 4B of the tubular reactor 4. The boat 21 made of a heat-resistant material such as quartz or SiC and includes a plurality of upstanding support columns 21A and a disk-shaped boat top plate 21B that fixes upper ends of the plurality of support columns 21A to each other. Additionally, the boat 21 includes an annular bottom plate 86 that fixes lower ends of the plurality of support columns 21A to each other (see FIG. 2). Here, the boat top plate 21B is an example of a top plate. In the present embodiment, note that the boat 21 includes the annular bottom plate 86 at the lower ends of the plurality of support columns 21A, but a disk-shaped bottom plate may be provided instead of the bottom plate 86.

For example, the boat 21 supports, in a horizontal attitude, 25 to 200 pieces of wafers 7 in multiple stages vertically arrayed with centers of the wafers mutually aligned. The wafers 7 are arrayed at regular intervals in the boat.

In the present embodiment, all of the wafers 7 held in the boat 21 are product wafers on which integrated circuit patterns are formed. In other words, in the boat 21, a plurality of product wafers each having a indented surface is held at all of positions where the wafers 7 can be held. In this context, product wafers may include one or more monitor wafers or fill-dummy wafers that also have integrated circuit patterns or an effective surface area as large as the product wafers. Assuming that the number of positions where the wafers 7 can be held is integral multiplication of the number of wafers (such as 25 pieces) that can be housed in a wafer container such as a front opening unified pod (FOUP), efficiency of substrate processing including transfer from the wafer container to the boat 21 can be maximized. For example, a product wafer has, on a front side, a pattern having a predetermined specific surface area of more than 50 times a substrate on which no pattern is formed (dummy wafer).

The inner tube 4B of the tubular reactor 4 may desirably have a minimum inner diameter so as to be able to safely carry in and out the boat 21. In the present embodiment, a diameter of the boat top plate 21B is set to 90% or more and 98% or less of the inner diameter of the inner tube 4B, or a pitch between adjacent wafers 7 held by the boat 21 is set to 6 mm or more and 16 mm or less, for example. Moreover, the diameter of the boat top plate 21B is preferably 90% or more and 98% or less, more preferably 92% or more and 97% or less, and still more preferably 94% or more and 96% or less of the inner diameter of the inner tube 4B. The diameter of the boat top plate 21B less than 90% of the inner diameter of the inner tube 4B causes gas transport by diffusion (especially inflow of the excessive $SiCl_2$ from upper side of the boat top plate into lower side), and so the redundant gas becomes more influential for environs. Alternatively, the diameter of top plate 21B greater than 98% of the inner diameter of the tube 4B may not comply with a certain safety factor against collisions between the boat 12 and the tube 4B. The top plate 21B may suppress the diffusion more by its diameter of not less than 92% and still more by the diameter of not less than 94% of the inner diameter of inner tube 4B. The top plate 21B may improve the safety factor more by its diameter of not greater than 97% and still more by the diameter of not greater than 96% of the inner diameter of inner tube 4B Additionally, the pitch between adjacent wafers 7 is preferably 6 mm or more and 16 mm or less, more preferably 7 mm or more and 14 mm or less, and still more preferably 8 mm or more and 12 mm or less. The pitch set to less than 6 mm makes the gas difficult to flow smoothly between the adjacent wafers 7, and thus uniformity of film within an wafer may be degraded. Moreover, the pitch less than 16 mm decreases productivity while improvement of the uniformity is limited. The pitch of 7 mm or more contributes better uniformity and the pitch of 8 mm or more contributes still better uniformity. The pitch of 14 mm or less provides better productivity and the pitch of 12 mm or less provides still better productivity.

Additionally, in the present embodiment, volume of an upper end space partitioned from others by the boat top plate 21B and interposed between the ceiling 74 and the boat top plate 21B is set to, for example, 1 time or more and 3 times or less volume of a space interposed between the wafers 7 adjacent (neighboring) to each other and held by the boat 21. Here, the volume of the upper end space interposed between the ceiling 74 and the boat top plate 21B is preferably 1 time or more and 3 times or less, more preferably 1 time or more and 2.5 times or less, and still more preferably 1 time or more and 2 times or less the volume of the space interposed between the wafers 7 adjacent to each other. That is, it is preferable that the volume of the upper end space interposed between the ceiling 74 and the boat top plate 21B is as small as possible. However, it is required that the gas flows smoothly to the main exhaust vent 4E. Since the volume of the upper end space interposed between the ceiling 74 and the boat top plate 21B is set to 3 times or less the volume of the space interposed between the wafers 7 adjacent to each other and held by the boat 21, an absolute amount of the excess gas is reduced. Furthermore, since the volume of the upper end space interposed between the ceiling 74 and the boat top plate 21B is set to 1 time or more the volume of the space interposed between the wafers 7 adjacent to each other and held by the boat 21, the gas flows smoothly to the main exhaust vent 4E.

Main exhaust vent 4E has one or more openings (apertures) facing edges of wafers 7 or upper spaces of the wafers (i.e. spaces interposed between two wafers 7 adjacent to each other and held by the boat 21 and a space between the top plate 21 and an wafer 7 at the top position of the boat 21) and exhaust the atmosphere inside the process chamber 6. Hence a gas flux (cross flow) is formed in which the gas flows along and parallel to whole top surface of the wafers 7 in the tubular reactor 4 from gas supply mechanism (supply slits 4F) to main exhaust vent 4E while mass transport across the wafers (in vertical direction) is almost limited to diffusion though a gap between the wafers 7 and the inner tube 4B.

A heat insulation assembly (heat insulation structure) 22 described later is provided at a lower portion of the boat 21. The heat insulation assembly 22 has a structure in which conduction or transmission of heat in the vertical direction becomes small, and normally has a cavity inside thereof. The assembly 22 has a height (vertical length) bigger than a diameter of the wafers. The inside of the assembly 22 can be purged by the axial purge gas. In the tubular reactor 4, an upper portion where the boat 21 is arranged will be referred to as a processing region A of the wafer 7, and a lower portion where the heat insulation assembly 22 is arranged will be referred to as a heat insulation region B.

A rotation mechanism 23 to rotate the boat 21 is installed on a side of the seal cap 19 opposite to the process chamber 6. The rotation mechanism 23 is connected to a gas supply pipe 24 of the axial purge gas. The gas supply pipe 24 is provided with an MFC 25 and a valve 26 sequentially from the upstream direction. One purpose of this purge gas is to protect the inside of the rotation mechanism 23 (e.g., bearing) from a corrosive gas and the like used in the process chamber 6. The purge gas is supplied from the rotation mechanism 23 along the rotary shaft 66 and guided into the heat insulation assembly 22.

A boat elevator 27 is provided in the vertical direction below and outside the tubular reactor 4, and operates as an elevation mechanism (transfer mechanism) that moves up and down the seal cap 19. With this structure, the boat 21 and the wafers 7 supported by the seal cap 19 are carried in and out of the process chamber 6. Meanwhile, while the seal cap 19 is moved down to a lowermost position, a shutter (not illustrated) closing a lower end opening of the tubular reactor 4 can be provided instead of the seal cap 19.

A temperature sensor (temperature detector) 28 functioning as a processing space temperature sensor to detect a temperature inside the tubular reactor 4 is installed inside an outer wall of a side portion of the outer tube 4A or on an inner side of the inner tube 4B. The temperature sensor 28 includes, for example, a plurality of thermocouples arrayed in the vertical direction. Although not illustrated, the temperature sensor 28 is electrically connected to the controller 29. The controller 29 adjusts respective power amounts to the upper heater 3A, center upper heater 3B, center heater 3C, center lower heater 3D, and lower heater 3E with the power regulator 70, on the basis of temperature information detected by the temperature sensor 28, and thereby the temperature inside the process chamber 6 is made to have desired temperature distribution.

Additionally, a temperature sensor (temperature detector) 82 functioning as an upper end space temperature sensor to detect a temperature of an upper portion inside the tubular reactor 4 is installed on an outer wall of the ceiling portion 72 of the outer tube 4A. The temperature sensor 82 includes, for example, a plurality of thermocouples arrayed in a horizontal direction. Although not illustrated, the temperature sensor 82 is electrically connected to the controller 29. The controller 29 adjusting a power amount to the ceiling heater 80 with the power regulator 70, on the basis of temperature information detected by the temperature sensor 82, and thereby the temperature of the upper portion inside the process chamber 6 is made to have desired temperature distribution.

The controller 29 is a computer to control the entire substrate processing apparatus 1, and electrically connected to the MFCs 10 and 13, the valves 11 and 14, the pressure sensor 16, the APC valve 17, the vacuum pump 18, the rotation mechanism 23, the boat elevator 27, and the like to receive signals from these components and control these components.

Figure 2:
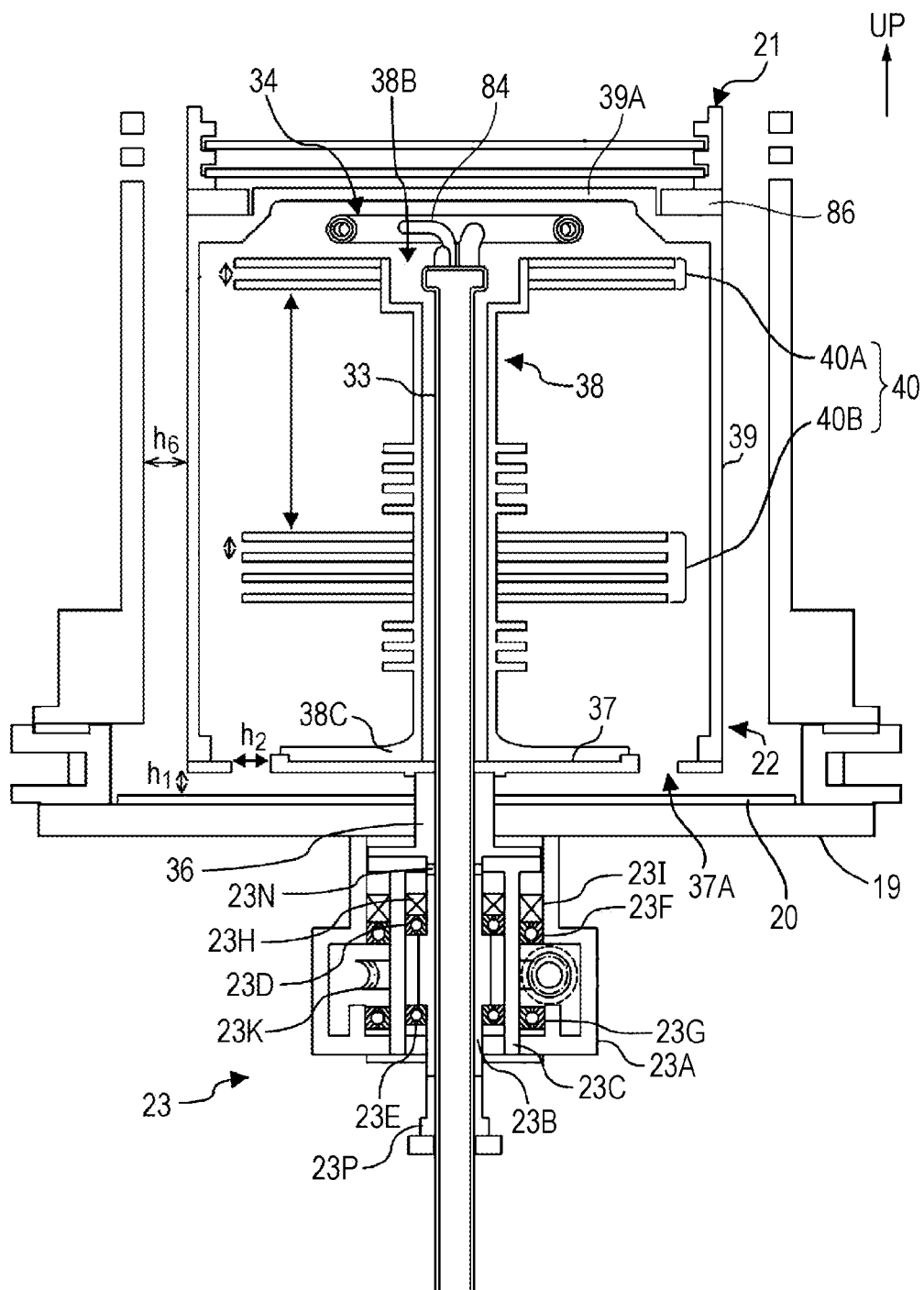
FIG. 2 is a longitudinal cross-sectional view of a heat insulation assembly in the substrate processing apparatus of the first embodiment.

FIG. 2 illustrates a cross-sectional view of the heat insulation assembly 22 and the rotation mechanism 23. As illustrated in FIG. 2, the rotation mechanism 23 includes a casing (body) 23A formed in a substantially cylindrical shape having an upper end opened and a lower end closed, and the casing 23A is fixed to a lower surface of the seal cap 19 with a bolt. Inside the casing 23A, a cylindrical inner shaft 23B and an outer shaft 23C formed in a cylindrical shape having a diameter larger than a diameter of the inner shaft 23B are coaxially provided sequentially from the inner side. Additionally, the outer shaft 23C is rotatably supported by a pair of upper and lower inner bearings 23D and 23E interposed in a space with the inner shaft 23B and a pair of upper and lower outer bearings 23F and 23G interposed in a space with the casing 23A. On the other hand, the inner shaft 23B is fixed to the casing 23A and is not rotatable.

Magnetic fluid seals 23H and 23I to separate vacuum from the air of an atmospheric pressure are installed on the inner bearing 23D and the outer bearing 23F, that is, on the process chamber 6 side. A worm wheel or a pulley 23K to be driven by an electric motor (not illustrated) or the like is mounted on the outer shaft 23C.

A sub-heater support column 33 functioning as an auxiliary heating mechanism to heat the wafers 7 from the lower side inside the process chamber 6 is vertically inserted through the inside of the inner shaft 23B. The sub-heater support column 33 is a pipe made of quartz, and concentrically holds the cap heater 34 at an upper end of the sub-heater support column. The sub-heater support column 33 is supported by a support portion 23N made of a heat resistant resin at an upper end position of the inner shaft 23B. Additionally, at a lower portion of the sub-heater support column 33, a space between the sub-heater support column 33 and the inner shaft 23B is airtightly sealed with vacuum fitting 23P.

The cap heater 34 is electrically connected to the power regulator 70 (see FIG. 1). The controller 29 controls the power amount to the cap heater 34 by the power regulator 70 (see FIG. 1). Consequently, a temperature of the cap heater 34 is controlled independently from temperatures of the upper heater 3A, center upper heater 3B, center heater 3C, center lower heater 3D, lower heater 3E, and ceiling heater 80.

A cylindrical rotary shaft 36 having a lower end provided with a flange is fixed to an upper surface of the outer shaft 23C formed in a flange shape. The sub-heater support column 33 passes through a cavity of the rotary shaft 36. In an upper end portion of the rotary shaft 36, a disk-shaped rotary table 37 is fixed while keeping an interval h1 from the cover plate 20, and a penetration hole where the sub-heater support column 33 passes through is formed at a center of the rotary table 37.

On an upper surface of the rotary table 37, a heat insulator holder 38 to hold a heat insulator 40 and a cylindrical portion 39 are concentrically placed and fixed with screws or the like. The cylindrical portion 39 includes a top plate 39A as a disk-shaped upper surface to close an upper end portion. The top plate 39A is arranged on the lower side of the boat 21 and constitutes a bottom of the processing region A (see FIG. 1). Additionally, the annular bottom plate 86 that fixes a lower end portion of the boat 21 is fitted to the top plate 39A in the circumference of the top plate 39A. The heat insulation assembly 22 includes the rotary table 37, heat insulator holder 38, cylindrical portion 39, and heat insulator 40, and the rotary table 37 constitutes a bottom plate (cradle). A plurality of exhaust holes 37A each having a diameter (width) h2 is formed on the rotary table 37 near an edge thereof in a rotationally symmetric manner.

In the present embodiment, volume of a lower end space interposed between the bottom plate 86 or the top plate 39A on the upper surface of the heat insulator 40 and a wafer 7 held at a lowermost position in the boat 21 where the wafer can be held is set to 0.5 times or more and 1.5 times or less the volume of a space interposed between the wafers 7 adjacent to each other and held in the boat 21. Here, the volume of the lower end space interposed between the wafer 7 and the bottom plate 86 or the top plate 39A is preferably 0.5 times or more and 1.5 times or less, more preferably 0.6 times or more and 1.3 times or less, and still more preferably 0.7 times or more and 1.0 times or less the volume of the space interposed between the wafers 7 adjacent to each other. If the volume of the lower end space is set to greater than 1.5 times the volume of the interposed space between the adjacent wafers 7, an increased absolute amount of the excess gas arises a bigger influence in the event that the excess gas leaks. If the volume of the lower end space is set to less than 0.5 times, ease of gas displacement among the lower end space is diminished. The lower end space of 0.6 times or more permits gases to flow more smoothly toward the nearest main exhaust vent 4E. The lower end space of 0.7 times or more permits gases to flow still more smoothly. Furthermore, the lower end space of 1.3 times or less the volume of the interposed space between the adjacent wafers 7, enable to reduce more excess gas and the lower end space of 1 time or less enable to reduce still more.

In the cap heater 34, a temperature sensor 84 functioning as a lower end space temperature sensor to detect a temperature of the cap heater 34 or a temperature of a lowermost wafer 7 is installed. The temperature sensor 84 includes, for example, a plurality of thermocouples arrayed in the horizontal direction at a height same as a height of the cap heater 34. Although not illustrated, the temperature sensor 84 is electrically connected to the controller 29 (see FIG. 1). The controller 29 adjusts a power amount supplied to the cap heater 34 with the power regulator 70 (see FIG. 1), on the basis of temperature information detected by the temperature sensor 84, and thereby a temperature at a lower portion inside the process chamber 6 is made to have desired temperature distribution.

The controller 29 adjusts, by the power regulator 70, power (i.e., power amount) supplied to the upper heater 3A, center upper heater 3B, center heater 3C, center lower heater 3D, lower heater 3E, ceiling heater 80, and cap heater 34 on the basis of the temperatures respectively detected by the temperature sensor 82 in the upper end space, temperature sensor 28 in the processing space, and temperature sensor 84 in the lower end space such that temperatures of the plurality of wafers 7 held at all of the positions are equalized. In other words, the temperatures in the entire processing region A can be equalized.

The heat insulator holder 38 has a cylindrical shape including, at a center thereof, a cavity where the sub-heater support column 33 passes through. A lower end of the heat insulator holder 38 includes a leg 38C having an outward flange shape having an outer diameter smaller than an outer diameter of the rotary table 37. Alternatively, an upper end of the heat insulator holder 38 is opened so as to allow the sub-heater support column 33 to protrude therefrom and constitutes a supply port 38B of a purge gas.

A channel having an annular cross section is formed between the heat insulator holder 38 and the sub-heater support column 33 to supply the axial purge gas to an upper portion of the heat insulation assembly 22. The purge gas supplied from the supply port 38B flows downward in the space between the heat insulator holder 38 and the inner wall of the cylindrical portion 39 and is exhausted from the exhaust holes 37A to the outside of the cylindrical portion 39. The axial purge gas exhausted from the exhaust holes 37A flows radially through a clearance between the rotary table 37 and the cover plate 20 and is released to the furnace throat to purge the furnace throat.

A plurality of reflection plates 40A and a plurality of heat insulating plates 40B are coaxially installed as the heat insulator 40 at a column of the heat insulator holder 38.

The cylindrical portion 39 has an outer diameter such that a gap h6 between the cylindrical portion 39 and the inner tube 4B has a predetermined value. The gap h6 is desirably set narrow in order to suppress passage of the process gas and the axial purge gas, and is preferably set to, for example, from 7.5 mm to 15 mm.

Figure 3:
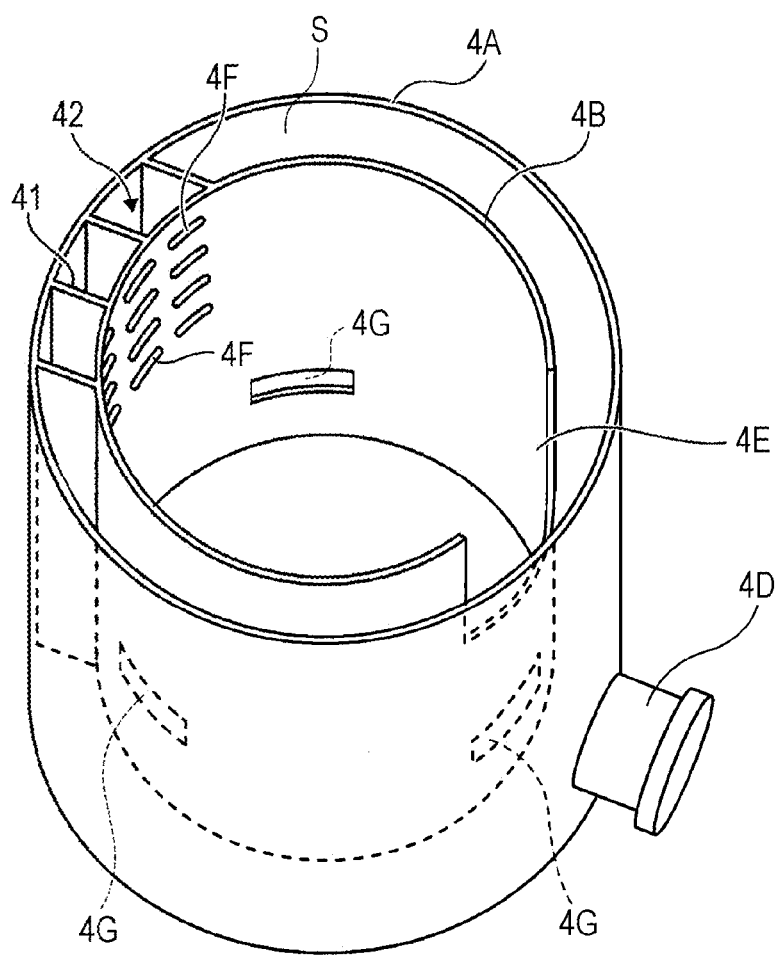
FIG. 3 is a perspective view including a cross section of a tubular reactor in the substrate processing apparatus of the first embodiment.

FIG. 3 illustrates a perspective view of the tubular reactor 4 taken along horizontally. Note that the flange 4C is omitted in FIG. 3. As illustrated in FIG. 3, the supply slits 4F to supply the process gas into the process chamber 6 are arrayed in a lattice shape at the inner tube 4B, and the supply slits 4F as many as the number of wafers 7 (refer to FIG. 1) are formed in a vertical direction and three supply slits 4F are formed in the lateral direction. Partition plates 41 extending in the vertical direction are provided between each of the supply slits 4F or at both ends thereof arrayed in the lateral direction so as to partition the exhaust space S between the outer tube 4A and the inner tube 4B. Each of the sections separated from the main exhaust space S by the plurality of partition plates 41 forms a nozzle chamber (nozzle buffer) 42. As a result, the exhaust space S is formed to have a C-shape cross section. An opening directly connecting each of the nozzle chambers 42 to the inside of the inner tube 4B is the supply slits 4F alone. Note that an upper end of each of the nozzle chambers 42 may be closed at a height substantially same as a height of the upper end of the inner tube 4B.

The partition plates 41 are connected to the inner tube 4B but not connected to the outer tube 4A and a small clearance can be provided therebetween in order to avoid stress caused by a temperature difference between the outer tube 4A and the inner tube 4B. Each of the nozzle chambers 42 is not necessarily completely separated from the exhaust space S, and may have an opening or a clearance communicating with the exhaust space S, particularly, at the upper end and a lower end thereof. Each of the nozzle chambers 42 is not limited to the one having an outer circumference side partitioned by the outer tube 4A, and a partition plate formed along the inner surface of the outer tube 4A may also be separately provided.

In the inner tube 4B, three sub-exhaust vents 4G are provided at positions opened to a side surface of the heat insulation assembly 22. One of the sub-exhaust vents 4G is provided in a direction same as that of the exhaust port 4D, and at least a part of the opening is arranged at a height overlapping with a pipe of the exhaust port 4D. Additionally, two other sub-exhaust vents 4G are arranged near both side portions of the nozzle chamber 42. Alternatively, the three sub-exhaust vents 4G may be arranged at positions spaced apart from each other at a 180-degree interval on the circumference of the inner tube 4B.

Figure 4:
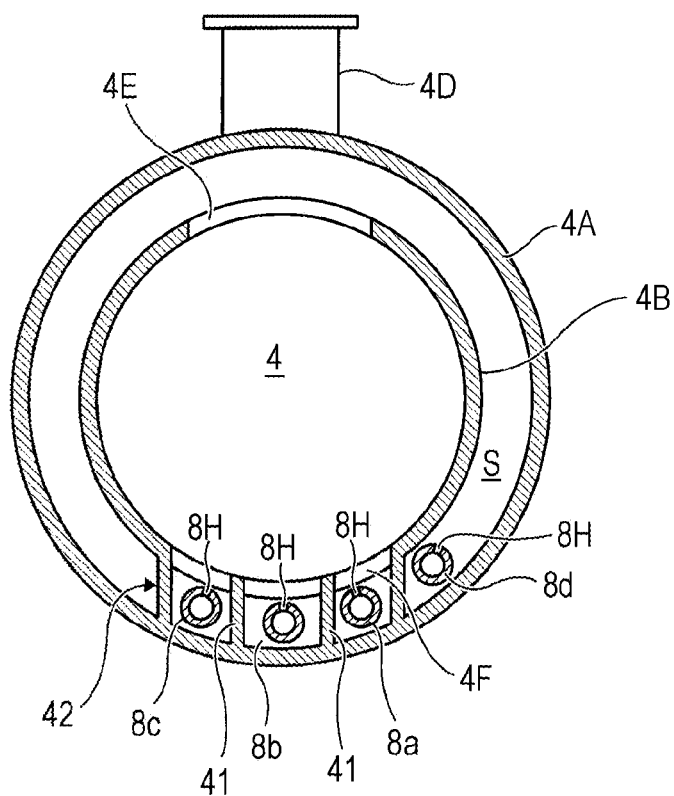
FIG. 4 is a cross-sectional view of the tubular reactor in the substrate processing apparatus of the first embodiment.

As illustrated in FIG. 4, nozzles 8a to 8c are installed in the three nozzle chambers 42, respectively. Side surfaces of the nozzles 8a to 8d are provided with nozzle holes 8H respectively in a manner opened toward the center of the tubular reactor 4. A gas ejected from each of the nozzle holes 8H is intended to flow from the supply slits 4F into the inner tube 4B, but a part of the gas does not flow directly. Since each of the nozzles 8a to 8c is installed in an independent space provided by the partition plates 41, it is possible to suppress mixture of the process gases supplied from the respective nozzles 8a to 8c inside the nozzle chambers 42. Furthermore, a gas staying in each of the nozzle chambers 42 can be discharged to the exhaust space S from the upper end or the lower end in each of the nozzle chambers 42. With this structure, it is possible to suppress formation of a thin film or generation of a by-product due to mixture of process gases inside the nozzle chamber 42. Note that, alone in FIG. 4, a purge nozzle 8d that can be optionally installed along the axial direction (vertical direction) of the tubular reactor is provided in the exhaust space S adjacent to the nozzle chambers 42. In the following, the description will be provided assuming that the purge nozzle 8d is not provided.

Figure 5:
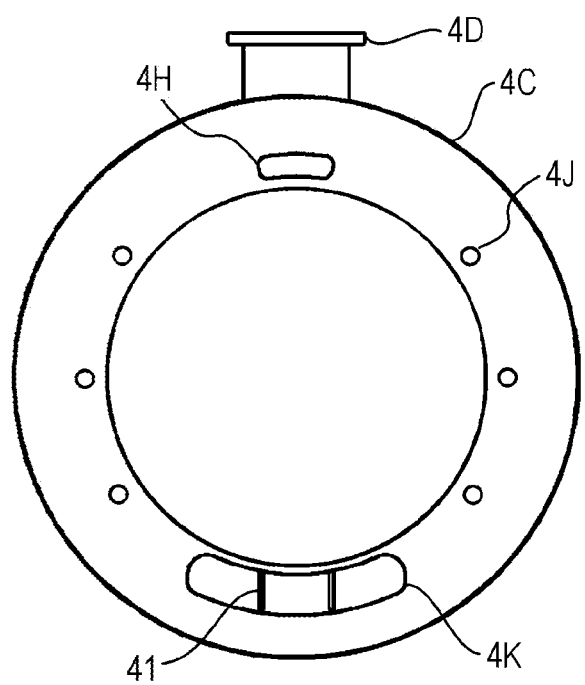
FIG. 5 is a bottom view of the tubular reactor in the substrate processing apparatus of the first embodiment.

FIG. 5 illustrates a bottom view of the tubular reactor 4. As illustrated in FIG. 5, the flange 4C is provided with the bottom exhaust vents 4H and 4J and the nozzle introduction holes 4K as openings to connect the exhaust space S (see FIG. 4) to a lower side the flange. The bottom exhaust vent 4H is an elongated hole provided at a position closest to the exhaust port 4D, and the bottom exhaust vents 4J are small holes provided at six places along the C-shaped exhaust space S. The nozzles 8a to 8c (see FIG. 4) are inserted from the openings of the nozzle introduction holes 4K. In a case where the openings of the bottom exhaust vents 4J are too large as described later, a flow velocity of the axial purge gas passing the respective openings is decreased, and the source gas or the like enters the furnace throat from the exhaust space S due to diffusion. Therefore, the exhaust ports may be formed as holes each having a central portion with a reduced diameter (narrowed).

Figure 6:
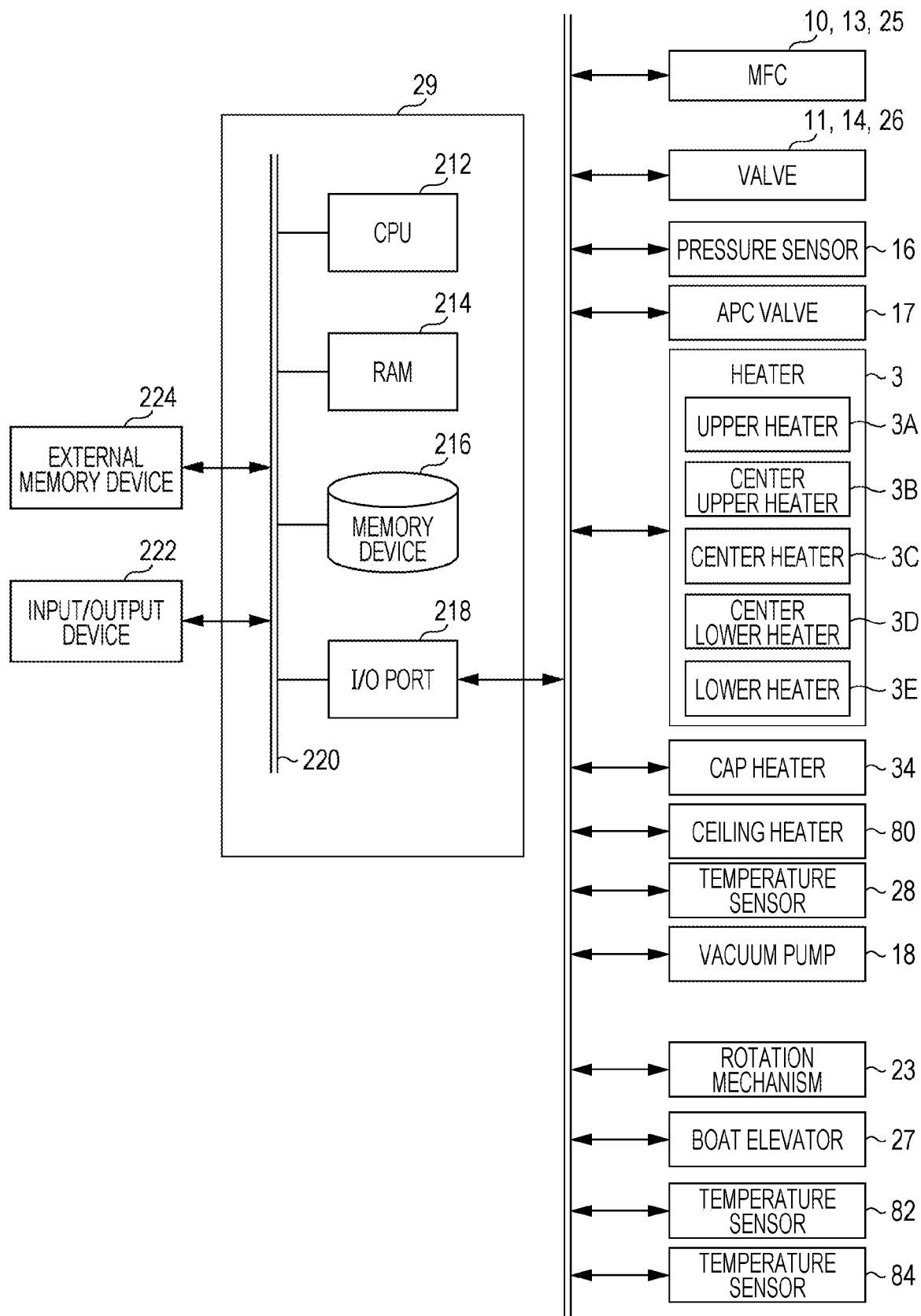
FIG. 6 is a configuration diagram of a controller in the substrate processing apparatus of the first embodiment.

As illustrated in FIG. 6, the controller 29 is electrically connected to each of the MFCs 10, 13, and 25, valves 11, 14, and 26, pressure sensor 16, APC valve 17, vacuum pump 18, rotation mechanism 23, boat elevator 27, and the like, and automatically controls these components. Additionally, the controller 29 is electrically connected to each of the heater 3 (upper heater 3A, center upper heater 3B, center heater 3C, center lower heater 3D, and lower heater 3E), ceiling heater 80, cap heater 34, temperature sensor 28, temperature sensor 82, temperature sensor 84, and the like, and automatically controls these components. Although not illustrated, the controller 29 is electrically connected to the heater 3 (upper heater 3A, center upper heater 3B, center heater 3C, center lower heater 3D, and lower heater 3E), ceiling heater 80, and cap heater 34 via the power regulator 70.

The controller 29 is formed as a computer including a central processing unit (CPU) 212, a random access memory (RAM) 214, a memory device 216, and an I/O port 218. The RAM 214, memory device 216, and I/O port 218 can exchange data with the CPU 212 via an internal bus 220. The I/O port 218 is connected to each of the above-described components. An input/output device 222 such as a touch panel is connected to the controller 29.

The memory device 216 includes, for example, a flash memory, a hard disk drive (HDD), and the like. The memory device 216 stores, in a readable manner, a control program to control operation of the substrate processing apparatus 1, and programs (recipes such as a process recipe and a cleaning recipe) to cause the respective components of the substrate processing apparatus 1 to perform film formation processing and the like in accordance with processing conditions. The RAM 214 is formed as a memory region (work region) in which a program, data, and the like read by the CPU 212 are temporarily stored.

The CPU 212 reads a control program from the memory device 216 and executes the same, also reads a recipe from the memory device 216 in response to an input of an operational command or the like from the input/output device 222, and controls each of the components in accordance with the recipe.

The controller 29 can be constituted by installing, in a computer, the above-described program persistently stored in an external memory device (for example, a semiconductor memory such as a USB memory or a memory card, an optical disk such as a CD or a DVD, or an HDD) 224. The memory device 216 and the external memory device 224 are formed as computer-readable tangible media. In the following, these memory devices are collectively and simply referred to as recording media. Note that a program may be provided in a computer by using a communication unit such as the Internet or a dedicated line without using the external memory device 224.

<Method of Manufacturing Semiconductor Device>

Next, an exemplary sequence of processing to form a film on a wafer 7 (hereinafter also referred to as film formation processing) will be described as a process in manufacturing processes for a semiconductor device (device) by using the substrate processing apparatus 1 described above.

Here, a description will be provided for an example of forming a silicon nitride (SiN) film on each of the wafers 7 by providing, for example, two or more nozzles 8, and supplying a hexa-chloro-disilane ($Si_2Cl_6$, that is, abbreviated as HCDS) gas as a first process gas (source gas) from a nozzle 8a and supplying an ammonia ($NH_3$) gas as a second process gas (source gas) from a nozzle 8b, respectively. The second process gas (source gas) may also be referred to as a reactant gas. In the following description, note that operation of each of the components of the substrate processing apparatus 1 is controlled by the controller 29.

In the film formation processing of the present embodiment, a process of supplying the HCDS gas to wafers 7 located inside the process chamber 6, a process of removing the HCDS gas (residual gas) from the inside of the process chamber 6, a process of supplying the $NH_3$ gas to the wafers 7 located inside the process chamber 6, and a process of removing the $NH_3$ gas (residual gas) from the inside of the process chamber 6 are repeated predetermined number of times (once or more) to form a SiN film on each of the wafers 7. In the present specification, this film formation sequence will be expressed as follows for the sake of convenience.

(HCDS→$NH_3$)×$n$=>SiN

In the present embodiment, film formation progresses while $SiCl_2$ (active species) provides Si into a crystal. There are various kinds of routes including (1) and (2) shown below in chemical reaction in which $SiCl_2$ is generated from HCDS, and there is not little possibility of the route (2) from an empirical viewpoint.

(1) Dissociative adsorption (chemisorption) of $Si_2Cl_6$
(2) Adsorption of $SiCl_2$ that has been decomposed under a predetermined equilibrium condition of $Si_2Cl_6<=>SiCl_2+SiCl_4$ in a vapor phase.

In either case, a concentration (partial pressure) of a precursor of $SiCl_2$ is decreased near a surface of each wafer 7 due to mass consumption of $SiCl_2$.

(Wafer Charge and Boat Load)

In the boat 21, a plurality of product wafers each having a pattern formed is held at all positions where the wafers 7 can be held. When the plurality of wafers 7 is charged (wafer charge) in the boat 21, the boat 21 is carried into the process chamber 6 by the boat elevator 27 (boat load). At this point, the seal cap 19 is brought into a state in which the lower end of the manifold 5 is airtightly closed (sealed) via the O-ring 19A. A small amount of the purge gas can be supplied into the cylindrical portion 39 by opening the valve 26 from a standby state before the wafer charge.

(Pressure Adjustment)

Vacuum exhaust (evacuation) is performed by the vacuum pump 18 such that the inside of the process chamber 6, namely, a space where wafers 7 exist is made to have a predetermined pressure (vacuum degree). At this point, the pressure inside the process chamber 6 is measured by a pressure sensor 16, and the APC valve 17 is subjected to feedback control on the basis of the measured pressure information. Supply of the purge gas into the cylindrical portion 39 and actuation of the vacuum pump 18 are kept on at least until the processing for the wafers 7 is completed.

(Elevated Temperature)

After oxygen and the like are sufficiently exhausted from the inside of the process chamber 6, the temperature inside the process chamber 6 is started to be elevated. The power amount to the heater 3 (the upper heater 3A, center upper heater 3B, center heater 3C, center lower heater 3D, and lower heater 3E) is subjected to feedback control on the basis of temperature information detected by the temperature sensor 28 such that the process chamber 6 achieves preferable predetermined temperature distribution for film formation. Additionally, the power amount to the ceiling heater 80 is subjected to feedback control on the basis of temperature information detected by the temperature sensor 82. Furthermore, the power amount to the cap heater 34 is subjected to feedback control on the basis of temperature information detected by the temperature sensor 84. Heating the inside of the process chamber 6 by the heater 3 (the upper heater 3A, center upper heater 3B, center heater 3C, center lower heater 3D, and lower heater 3E), by the ceiling heater 80, and by the cap heater 34 is performed at least until the processing for the wafers 7 (film formation) is completed. A power application period to the cap heater 34 does not need to coincide with a heating period by the heater 3. It is preferable that the temperature of the cap heater 34 reaches a temperature same as a film formation temperature and an inner surface temperature of the manifold 5 desirably reaches 180° C. or more (for example, 260° C.) immediately before start of film formation.

Additionally, rotation of the boat 21 and wafers 7 by the rotation mechanism 23 is started. Since the boat 21 is rotated by the rotation mechanism 23 via the rotary shaft 66, rotary table 37, and cylindrical portion 39, the wafers 7 are rotated without rotating the cap heater 34. Consequently, uneven heating can be reduced. The boat 21 and wafers 7 are continuously rotated by the rotation mechanism 23 at least until the processing for the wafers 7 is completed.

(Film Formation)

When the temperature inside the process chamber 6 is stabilized at a preset processing temperature, steps 1 to 4 are repeatedly executed. Note that the valve 26 may be opened to increase supply of the purge gas ($N_2$) before starting step 1.

[Step 1: Source Gas Supply Process]

In step 1, the HCDS gas is supplied to wafers 7 inside the process chamber 6. The valve 14 is opened simultaneously with opening of the valve 11, and the HCDS gas is made to flow into the gas supply pipe 9, and a $N_2$ gas is made to flow into the gas supply pipe 12. Flow rates of the HCDS gas and $N_2$ gas are adjusted by the MFCs 10 and 13, respectively, and are supplied into the process chamber 6 via the nozzle chambers 42 and then exhausted from the exhaust pipe 15. Since the HCDS gas is supplied to the wafers 7, a silicon (Si)-containing film having a thickness that is less than monolayer and up to several atomic layers is formed as a first layer on an outermost surface of each of the wafers 7.

[Step 2: Source Gas Exhaust Process]

After the first layer is formed, the valve 11 is closed and supply of HCDS gas is stopped. At this point, vacuum exhaust is performed by the vacuum pump 18 inside the process chamber 6 with the APC valve 17 kept opened, and the HCDS gas remaining inside the process chamber 6 and not having reacted or having contributed to formation of the first layer is exhausted from the inside of the process chamber 6. Additionally, the supplied $N_2$ gas purges the gas supply pipe 9, the inside of the tubular reactor 4, and the furnace throat with the valve 14 and valve 26 kept opened.

[Step 3: Reactant Gas Supply Process]

In step 3, the $NH_3$ gas is supplied to the wafers 7 inside the process chamber 6. Opening and closing control of the valves 11 and 14 are performed by a procedure similar to opening and closing control of the valves 11 and 14 in step 1. The flow rates of the $NH_3$ gas and $N_2$ gas are adjusted by the MFCs 10 and 13, respectively, and are supplied into the process chamber 6 via the nozzle chambers 42 and then exhausted from the exhaust pipe 15. The $NH_3$ gas supplied to the wafers 7 reacts with at least a part of the first layer, that is, the Si-containing film formed on each of the wafers 7 in step 1. With this reaction, the first layer is nitrided and changed (modified) into a second layer containing Si and N, namely, a silicon nitride layer (SiN layer).

[Step 4: Reactant Gas Exhaust Process]

After the second layer is formed, the valve 11 is closed and supply of the $NH_3$ gas is stopped. Then, the $NH_3$ gas and a reaction by-product, which remain inside the process chamber 6 and have not reacted or have contributed to formation of the second layer, are exhausted from the inside of the process chamber 6 by processing procedures similar to step 1.

A SiN film having predetermined composition and a predetermined film thickness can be formed on each of the wafers 7 by performing, the predetermined number of times (n times), a cycle of the above-described four steps non-simultaneously, that is, without overlapping.

Examples of processing conditions of the above sequence are as follows:

processing temperature (wafer temperature): 250 to 700° C.;

processing pressure (pressure in process chamber): 1 to 4000 Pa;

HCDS gas supply flow rate: 1 to 2000 sccm;

$NH_3$ gas supply flow rate: 100 to 10000 sccm;

$N_2$ gas supply flow rate (nozzle): 100 to 10000 sccm; and $N_2$ gas supply flow rate (rotary shaft): 100 to 500 sccm.

The film formation processing may be made to appropriately proceed by setting the respective processing conditions to values within the respective ranges.

A heat decomposable gas such as the HCDS gas may tend to form a by-product film on a surface of a metal rather than on quartz. SiO, SiON, and the like easily adhere to the surface exposed to HCDS (and ammonia) gas especially at 260° C. or less.

(Purge and Restoration of Atmospheric Pressure)

After completion of the film formation processing, the valve 14 is opened to supply the $N_2$ gas into the process chamber 6 from the gas supply pipe 12 and exhaust the gas from the exhaust pipe 15. Consequently, an atmosphere inside the process chamber 6 is replaced with an inert gas (inert gas replacement), and a remaining source material and a by-product are removed (purged) from the process chamber 6. After that, the APC valve 17 is closed, and the $N_2$ gas is charged until the pressure inside the process chamber 6 reaches an ordinary pressure (restoration of atmospheric pressure).

(Boat Unload and Wafer Discharge)

The seal cap 19 is moved down by the boat elevator 27 and the lower end of the manifold 5 is opened. Then, the processed wafers 7 are carried out to the outside of the tubular reactor 4 from the lower end of the manifold 5 in a state that the processed wafers 7 are supported by the boat 21. The processed wafers 7 are extracted from the boat 21.

With execution of the above film formation processing, a SiN film containing nitrogen and the like deposit on a surface of a member inside the tubular reactor 4 that has been heated, for example, an inner wall of the outer tube 4A, a surface of the nozzle 8a, a surface of the inner tube 4B, a surface of the boat 21, and the like. Accordingly, cleaning is performed when an amount of such deposits, that is, a cumulative film thickness reaches a predetermined amount (thickness) before the deposits are peeled off or fall down.

The cleaning processing is performed by, for example, supplying a $F_2$ gas as a fluorine-based gas into the tubular reactor 4.

<Actions and Effects>

In the above-described substrate processing apparatus 1, temperatures in the vertical direction of the process chamber 6 can be controlled substantially uniform by controlling the temperatures of the upper heater 3A, center upper heater 3B, center heater 3C, center lower heater 3D, lower heater 3E, cap heater 34, and ceiling heater 80, respectively. Therefore, product wafers can be held at all of positions in the boat 21 where the wafers 7 can be held, and a dummy wafer can be eliminated.

Additionally, when the source gas decomposed in the gas phase is supplied from the gas supply pipe 9 in a state where the product wafers are held at all of the positions in the boat 21 where the wafers 7 can be held, a partial pressure of one species ($SiCl_2$) of a product gas generated by the decomposition is made substantially uniform at all of the positions in the boat 21 where the wafers 7 are held. Consequently, thicknesses of films formed on the plurality of product wafers arrayed in the vertical direction of the boat 21 can be suppressed from being non-uniform among the product wafers.

Furthermore, in the substrate processing apparatus 1, the number of product wafers can be increased and productivity can be improved by, for example, eliminating dummy wafers arranged on an upper end side and a lower end side of the product wafers. Alternatively, instead of increasing the number of product wafers, a pitch of the product wafers can be increased by an amount of eliminating the dummy wafers.

Additionally, in the substrate processing apparatus 1, the diameter of the boat top plate 21B is set to, for example, 90% or more and 98% or less of the inner diameter of the inner tube 4B, or a pitch between adjacent wafers 7 held by the boat 21 is set to, for example, 6 mm or more and 16 mm or less. Since the diameter of the boat top plate 21B is set to be 90% or more of the inner diameter of the inner tube 4B, gas movement caused by diffusion (particularly, excessive flow of $SiCl_2$ from above the boat top plate 21B toward the side of the wafers 7) can be suppressed. Furthermore, since the diameter of the boat top plate 21B is set to 98% or less of the inner diameter of the inner tube 4B, the boat 21 can be safely carried in and out from the inner tube 4B.

Additionally, the volume of the upper end space interposed between the ceiling 74 and the boat top plate 21B is set to, for example, 1 time or more and 3 times or less the volume of the space interposed between the wafers 7 adjacent (neighboring) to each other and held by the boat 21. Since the volume of the upper end space interposed between the ceiling 74 and the boat top plate 21B is set to 3 times or less the volume of the space interposed between the wafers 7 adjacent to each other and held by the boat 21, an absolute amount of the excess gas is reduced. Furthermore, since the volume of the upper end space interposed between the ceiling 74 and the boat top plate 21B is set to 1 time or more the volume of the space interposed between the wafers 7 adjacent to each other and held by the boat 21, the gas flows smoothly to the main exhaust vent 4E.

Additionally, in the substrate processing apparatus 1, the volume of the lower end space interposed between the bottom plate 86 or the top plate 39A of the upper surface of the heat insulator 40 and a wafer 7 held at the lowermost position in the boat 21 where the wafer 7 can be held is set to, for example, 0.5 times or more and 1.5 times or less the volume of the space interposed between the wafers 7 adjacent to each other and held by the boat 21. Since the volume of the lower end space interposed between the bottom plate 86 or the top plate 39A and the mentioned wafer 7 is set to 1.5 times or less the volume of the space interposed between the wafers 7 adjacent to each other, an absolute amount of an excess gas is reduced. Furthermore, since the volume of the lower end space interposed between the bottom plate 86 or the top plate 39A and the mentioned wafer 7 is set to 1 time or more the volume of the space interposed between the wafers 7 adjacent to each other, the gas flows into the main exhaust vent 4E smoothly.

Figure 7:
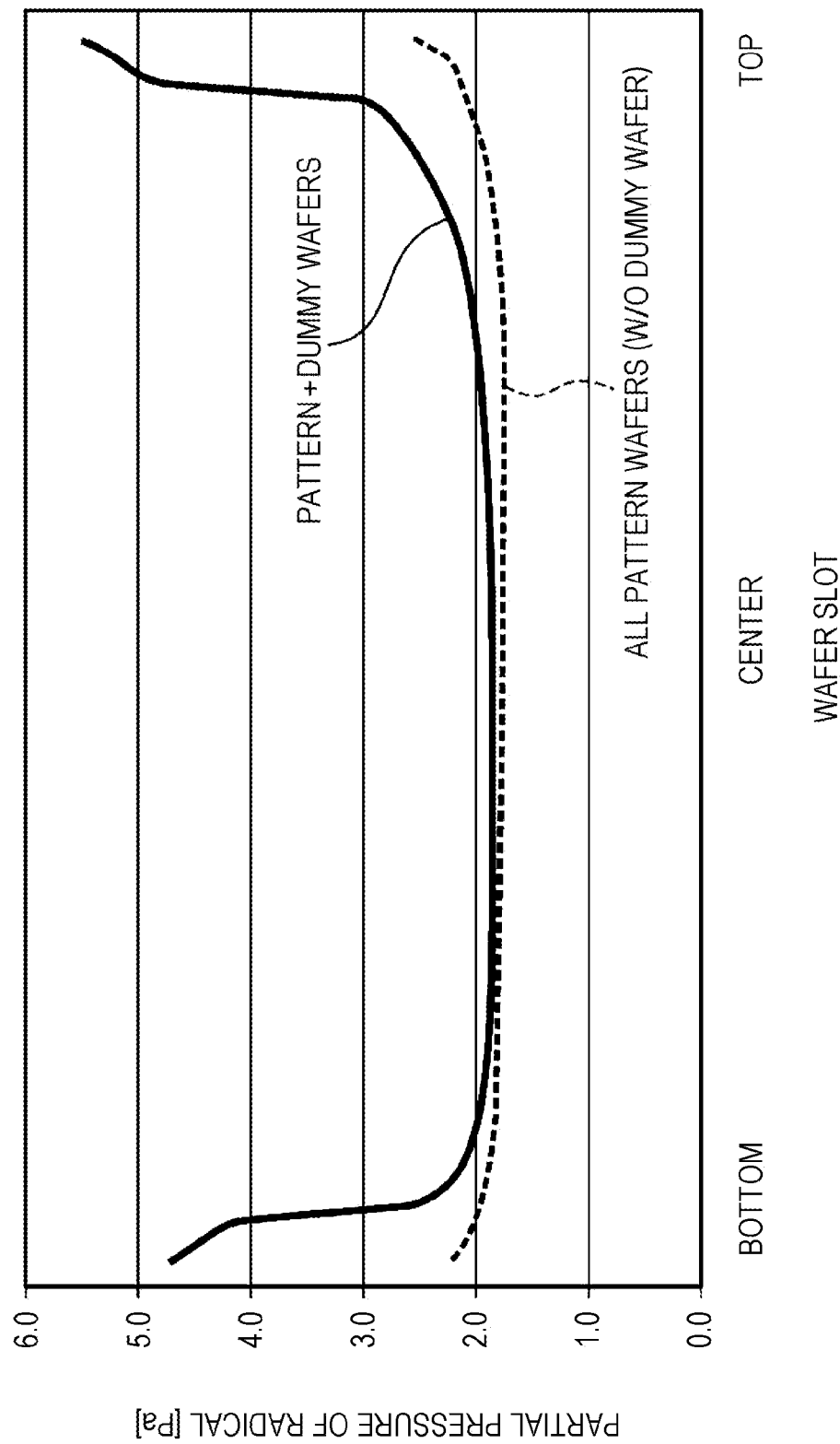
FIG. 7 is a diagram illustrating analysis results on radical distribution relative to holding positions when product wafers are held at all of holding positions in a boat of the substrate processing apparatus of the first embodiment and when dummy wafers are held above and below product wafers at holding positions in a boat of a substrate processing apparatus of a comparative example.

FIG. 7 illustrates, for the substrate processing apparatus 1 of the first embodiment, an analysis result of radical distribution relative to holding positions when pattern wafers (product wafers) are held at all of the holding positions in the boat 21. Additionally, FIG. 10 illustrates an analysis result of radical distribution relative to wafer holding positions when dummy wafers are held on an upper end side and a lower end side of pattern wafers held at the holding positions in the boat 21 of a substrate processing apparatus of a comparative example (see FIG. 7). Here, radicals are atoms or molecules having unpaired electrons generated when HCDS reacts.

As illustrated in FIG. 10, in the substrate processing apparatus of the comparative example, a few pieces of dummy wafers not used as products are held on the upper end side and the lower end side of the pattern wafers (product wafers). In the substrate processing apparatus of the comparative example, a heater arranged along the vertical direction is provided around a tubular reactor, but temperature sensors 82 and 84 like the first embodiment are not provided, and there is no structure in which a soaking region is not increased by independently controlling temperatures of a cap heater and a ceiling heater. Here, since a pattern is formed on a pattern wafer, the pattern wafer has large surface area than surface area of a wafer having no pattern, and radical consumption is intense promotional to the surface area. In a dummy wafer, no pattern is formed (surface area is smaller than the surface area of a pattern wafer), and radical consumption is almost none. In the substrate processing apparatus of the comparative example, a reason why the dummy wafers are arranged on the upper end side and the lower end side of the pattern wafers is to deem the pattern wafers interposed between the dummy wafers as a part of the pattern wafers regularly arrayed in an infinite length (the part of the pattern wafers is not affected by an edge effect and temperatures and gas concentrations are equalized).

As illustrated in FIG. 10, in the substrate processing apparatus of the comparative example, it can be grasped that uniformity of radical distribution is deteriorated at an upper end portion and lower end portion of the pattern wafers. The reason is that a loading effect is caused by a difference between the dummy wafers having almost no radical consumption and the pattern wafers having intense radical consumption (proportional to each surface area). That is, a radical concentration in the gas phase is low because the surface area on each of the pattern wafers is large and radical consumption is intense, whereas radical concentration in the gas phase is high on each of the dummy wafers because consumption is little. In a region where the pattern wafer and the dummy wafer between which there is such an extreme concentration difference are adjacent to each other, concentration diffusion occurs in the gas phase, and the radical concentration difference is reduced. Therefore, the concentration inevitably becomes high in the upper end portion and the lower end portions of the pattern wafers (film thickness becomes thick), and uniformity of the film thickness is deteriorated.

On the other hand, in the substrate processing apparatus 1 of the first embodiment, the pattern wafers (product wafers) are held at all of the holding positions for the wafers 7 in the boat 21. Additionally, in the substrate processing apparatus 1, the dummy wafers can be eliminated because temperatures in regions of the upper end portion and the lower end portion of the pattern wafers can be controlled to be substantially uniform by controlling the respective temperatures of the upper heater 3A, center upper heater 3B, center heater 3C, center lower heater 3D, lower heater 3E, cap heater 34, and ceiling heater 80.

As illustrated in FIG. 7, it can be grasped that uniformity of radical distribution is improved overall when the pattern wafers (product wafers) are held at all of the holding positions for the wafers 7 in the boat 21 (see a broken line in the graph of FIG. 7). The reason is that there is no consumption difference between the dummy wafers and the pattern wafers unlike the comparative example because the pattern wafers are held at all of the holding positions for the wafers 7 in the boat 21.

However, in FIG. 7, a region of high concentration is still observed in the upper end portion and the lower end portion of the pattern wafers (product wafers). It is considered that the difference is due to the influence of the space outside the pattern wafer region, namely, the space between the boat top plate 21B and the inner tube 4B of the tubular reactor 4. This space is surrounded by quartz constituting the inner tube 4B, and radicals are diffused to the vicinity of the wafers 7 due to diffusion although there is no active gas flow. Additionally, provided that consumption of radicals on a quartz surface is equivalent to consumption on a bare wafer (wafer having a surface where a silicon flat surface alone is exposed), a concentration in this space is also thicker than the concentration on the pattern wafers, and a concentration difference is caused here.

Figure 8:
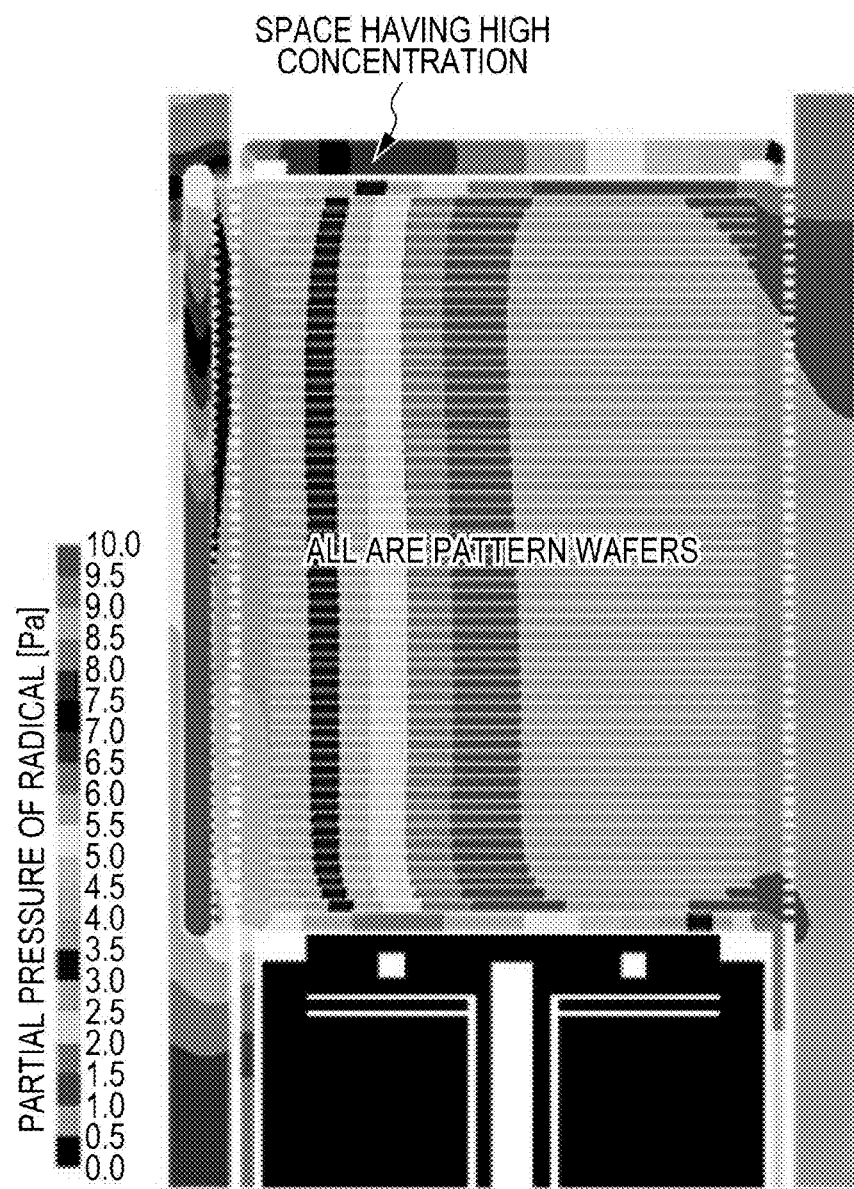
FIG. 8 is a diagram illustrating an analysis result on radical distribution inside the tubular reactor when the product wafers are held at all of holding positions in the boat of the substrate processing apparatus of the first embodiment.

FIG. 8 illustrates an analysis result on radical distribution relative to holding positions of the wafers 7 arranged in the vertical direction of the boat 21 at the time of holding pattern wafers (product wafers) at all of the holding positions for the wafers 7 in the boat 21. As illustrated in FIG. 8, it can be grasped that there is a space having a high radical concentration on the upper end side of the boat 21. To improve such a situation, substrate processing apparatuses according to a First Modified Embodiment and a Second Modified Embodiment will be described below.

First Modified Embodiment

A substrate processing apparatus 100 according to a First Modified Embodiment will be described with reference to FIG. 9. Note that components same as those in a first embodiment described above will be denoted by the same reference signs, and descriptions thereof will be omitted.

Figure 9:
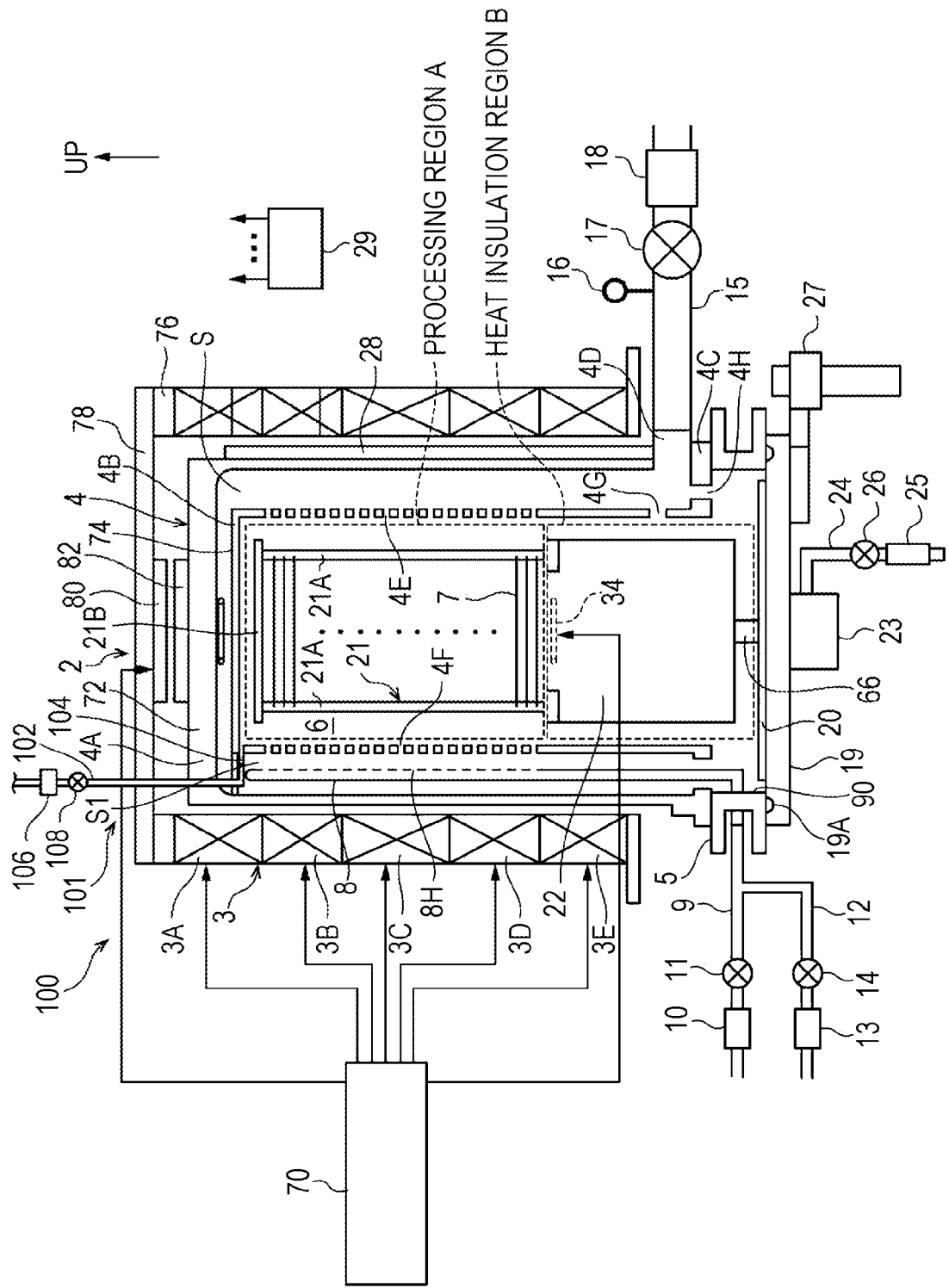
FIG. 9 is a schematic diagram of a substrate processing apparatus according to a first modified embodiment.

As illustrated in FIG. 9, the substrate processing apparatus 100 is provided with a supply device 101 as a purge gas supply mechanism to supply a purge gas (inert gas) to an upper end space between a boat top plate 21B and a ceiling 74 of an inner tube 4B. The supply device 101 includes: a supply pipe 102 to supply a purge gas; and a nozzle 104 provided at an end of the supply pipe 102 and introducing the purge gas into the upper end space between the boat top plate 21B and the ceiling 74 of the inner tube 4B. The nozzle 104 is provided at an upper end side portion of the inner tube 4B. The supply pipe 102 is provided with an MFC 106 and a valve 108. As the purge gas, $N_2$ is used, for example.

In the substrate processing apparatus 100, the purge gas is supplied from the supply pipe 102 to the upper end space between the boat top plate 21B and the ceiling 74 of the inner tube 4B via the nozzle 104. Consequently, one species (e.g., $SiCl_2$) of a product gas is diluted by the purge gas, and a partial pressure is reduced. That is, a radical concentration in the vertical direction of the boat 21 is made substantially uniform by diluting a radical concentration in the upper end space between the boat top plate 21B and the ceiling 74 of the inner tube 4B with the purge gas. Therefore, it is possible to more effectively suppress thicknesses of films formed on wafers 7 from being non-uniform among the wafers 7 at the time of holding product wafers at all of positions in a boat 21 where the wafers 7 can be held.

Note that a $N_2$ gas added with $H_2$ may also be used as a purge gas in the supply device 101. Since hydrogen bonds with $SiCl_2$ and consumes the $SiCl_2$, it can be expected that an equilibrium condition is shifted in a direction of decreasing a $SiCl_2$ concentration. Alternatively, the substrate processing apparatus 100 may have a structure provided with a supply pipe and a nozzle, instead of the supply device 101, to supply, via a manifold 5, an inert gas to the upper end space between the boat top plate 21B and the ceiling 74 of the inner tube 4B from a gas supply pipe 12 that supplies the inert gas.

Second Modified Embodiment

Next, a substrate processing apparatus according to a Second Modified Embodiment will be described. Note that components same as those of a first embodiment and a First Modified Embodiment described above will be denoted by the same reference signs, and descriptions thereof will be omitted.

Although not illustrated, in the substrate processing apparatus of the Second Modified Embodiment, a solid is disposed on an inner surface of a ceiling 74 of an inner tube 4B facing a boat top plate 21B. The solid includes a porous or sintered body to which one species (e.g., $SiCl_2$ as a silylene) of a product gas is adsorbed, and the product gas is consumed to decrease a partial pressure of the product gas to a degree equivalent to a product wafer having a pattern formed. As the solid, for example, a plate material having a surface with regularities and machined in a scale larger than a scale of a pattern of a product wafer is used, and the solid has large surface area capable of performing adsorption by the machined surface and pores (micropores) of the solid material itself. In the pores, unique phenomena such as Knudsen diffusion or capillary condensation dependent on a gas molecular weight occurs, and therefore, at least some of the pores each have an inner diameter selected within a range of 10 to 100 nm, for example, conforming to a pattern of a wafer. Furthermore, in a case where distribution of diameters of the pores is made constant in the range from several tens of nanometers to several hundreds of nanometers, the solid can be used for a relatively long period without replacement even when a pore is blocked due to deposition. In the Second Modified Embodiment, for example, a plurality of plate materials each having the surface with regularities is arranged along, for example, the inner surface of the ceiling 74 in a space between the ceiling 74 and the boat top plate 21B, namely, a soaking region. An arrangement interval may be narrow, for example, and can be selected within a range of 2 to 3 mm.

The substantial surface area of the solid is, for example, 0.1 times or more and 1.0 times or less surface area of a front side of a product wafer. The substantial surface area of the solid is preferably 0.1 times or more and 1.0 time or less, more preferably 0.2 times or more and 0.7 times or less, and still more preferably 0.3 times or more and 0.6 times or less the surface area of the front side of the product wafer. A source gas is not actively supplied to an upper end space between the boat top plate 21B and the ceiling 74 of the inner tube 4B, and the source gas flows from a clearance between the boat top plate 21B and the inner surface of the inner tube 4B. Therefore, the substantial surface area of the solid may be 1.0 time or less the surface area of the front side of the product wafer. Since the substantial surface area of the solid is set to 0.1 times or more the surface area of the front side of the product wafer, the product gas (e.g., $SiCl_2$) can be more effectively adsorbed and consumed in the upper end space.

Consequently, it is possible to reduce a concentration difference of one species (e.g., $SiCl_2$) of product gas between the space inside the ceiling 74 of the inner tube 4B and the product wafer. Therefore, when the product wafers are held at all of positions in a boat 21 where the wafers 7 can be held, thicknesses of films formed on the wafers 7 can be more effectively prevented from being non-uniform among the wafers 7.

Meanwhile, instead of providing the solid on the inner surface of the ceiling 74 of the inner tube 4B facing the boat top plate 21B, a surface (quartz surface) on an inner side of the ceiling 74 of the inner tube 4B may be machined to have irregularities.

According to this present disclosure, thicknesses of films respectively formed on a plurality of substrates arrayed in the vertical direction of the substrate holder can be prevented from being non-uniform among the substrates.

While this present disclosure has been described in detail with respect to the specific embodiments, this present disclosure is not limited to the embodiments, and it is obvious to a person skilled in the art that various other embodiments can be made within the scope of this present disclosure.

What is claimed is:

1. A substrate processing apparatus comprising:
   a substrate holder configured to hold a plurality of substrates in an array at respective positions at predetermined intervals and used to hold a plurality of product substrates at the positions where the substrates are allocable and not hold any dummy substrate along with the product substrates;
   a tubular reactor including an opening through which the substrate holder can be carried in and out at a lower side and a ceiling with a flat inner surface and houses the substrate holder;
   a furnace body surrounding an upper side and a lateral side of the tubular reactor;
   a main heater provided in the furnace body and configured to heat the side portion of the tubular reactor;
   a ceiling heater provided in the furnace body and configured to heat the ceiling;
   a lid that closes the opening;
   a cap heater arranged inside the tubular reactor and also located below the substrate holder and configured to perform heating;
   and
   a gas supply mechanism configured to individually supply a gas to a top side of each of the plurality of product substrates held by the substrate holder inside the tubular reactor, wherein a volume of an upper end space partitioned from others by the top plate and interposed between the ceiling and the top plate is set to 1 time or more and 3 times or less volume of a space interposed between the product substrates adjacent to each other and held by the substrate holder.

2. The substrate processing apparatus according to claim 1, wherein:
the substrate holder further includes a disk-shaped or annular bottom plate that fixes lower ends of the plurality of support columns to each other and is fitted to an upper surface of the insulation structure;
volume of a lower end space interposed between the bottom plate or the upper surface of the heat insulation structure and the product substrate held at a lowermost position in the substrate holder where the substrate can be held is set to 0.5 times or more and 1.5 times or less volume of a space interposed between the product substrates adjacent to each other and held by the substrate holder; and
the gas supply mechanism individually supplies the source gas to the lower end space.

3. The substrate processing apparatus according to claim 2, wherein the opening of the main exhaust vent further faces the lower end space.

4. The substrate processing apparatus according to claim 1, wherein the gas supply mechanism comprises a nozzle that is located beside the array of the plurality of substrates, configured to feed the gas flow from a single pipe, distributes the gas into nozzle holes and discharges the gas through the nozzle holes toward spaces above or edges of all the plurality of product substrates held by the substrate holder inside the tubular reactor.

5. A method of manufacturing a semiconductor device, using the substrate processing apparatus according to claim 1, the method sequentially repeating:
a first process in which a gas supply mechanism supplies a first source gas to a plurality of product substrates;
a second process in which the gas supply mechanism supplies a purge gas to the plurality of product substrates;
a third process in which the gas supply mechanism supplies a second source gas to the plurality of product substrates; and
a fourth process in which the gas supply mechanism supplies a purge gas to the plurality of product substrates.

6. A substrate processing apparatus comprising:
a substrate holder configured to hold a plurality of substrates in an array at respective positions at predetermined intervals and used to hold a plurality of product substrates at the positions where the substrates are allocable and not hold any dummy substrate along with the product substrates;
a tubular reactor including an opening through which the substrate holder can be carried in and out at a lower side and a ceiling with a flat inner surface and houses the substrate holder;
a furnace body surrounding an upper side and a lateral side of the tubular reactor;
a main heater provided in the furnace body and configured to heat the side portion of the tubular reactor;
a ceiling heater provided in the furnace body and configured to heat the ceiling;
a lid that closes the opening;
a cap heater arranged inside the tubular reactor and also located below the substrate holder and configured to perform heating;
a gas supply mechanism configured to individually supply a gas to a top side of each of the plurality of product substrates held by the substrate holder inside the tubular reactor; and
a heat insulation structure arranged between the substrate holder and the lid; and
a main exhaust vent including at least one opening, facing sides of the substrates or upper spaces of the substrates without any obstacle, for exhausting an atmosphere inside the tubular reactor,
wherein the gas supply mechanism comprises supply slits or the spouts placed at positions opposite to the main exhaust vent and configured to supply the gas to the respective product substrates,
wherein a gas flux that flows parallel with the product substrates is formed in the tubular reactor,
wherein the main heater, the ceiling heater and the cap heater are configured to be independently controllable,
wherein the substrate holder includes a plurality of upstanding support columns and a disk-shaped top plate that fixes upper ends of the plurality of support columns; and
wherein a diameter of the top plate is set to 90% or more and 98% or less of an inner diameter of the tubular reactor.

7. The substrate processing apparatus according to claim 6, wherein the substrate holder includes a plurality of upstanding support columns and a disk-shaped top plate that fixes upper ends of the plurality of support columns;
wherein a pitch between the adjacent product substrates held by the substrate holder is set to 6 mm or more and 16 mm or less; and
wherein volume of an upper end space partitioned from others by the top plate and interposed between the ceiling and the top plate is set to 1 time or more and 3 times or less volume of a space interposed between the product substrates adjacent to each other and held by the substrate holder.

8. A substrate processing apparatus comprising:
a substrate holder configured to hold a plurality of substrates in an array at respective positions at predetermined intervals and used to hold a plurality of product substrates at the positions where the substrates are allocable and not hold any dummy substrate along with the product substrates;
a tubular reactor including an opening through which the substrate holder can be carried in and out at a lower side and a ceiling with a flat inner surface and houses the substrate holder;
a furnace body surrounding an upper side and a lateral side of the tubular reactor;
a main heater provided in the furnace body and configured to heat the side portion of the tubular reactor;
a ceiling heater provided in the furnace body and configured to heat the ceiling;
a lid that closes the opening;
a cap heater arranged inside the tubular reactor and also located below the substrate holder and configured to perform heating; and
a gas supply mechanism configured to individually supply a gas to a top side of each of the plurality of product substrates held by the substrate holder inside the tubular reactor, wherein the substrate holder further includes a disk-shaped or annular bottom plate that fixes lower ends of the plurality of support columns to each other and is fitted to an upper surface of the insulation structure, volume of a lower end space interposed between the bottom plate or the upper surface of the heat insulation structure and the product substrate held at a lowermost position in the substrate holder where the substrate can be held is set to 0.5 times or more and 1.5 times or less volume of a space interposed between the product substrates adjacent to each other and held by the substrate holder, and the gas supply mechanism individually supplies the source gas to the lower end space.

* * * * *